(12) United States Patent
Naniwa

(10) Patent No.: US 10,938,436 B2
(45) Date of Patent: Mar. 2, 2021

(54) FRONT-END MODULE AND COMMUNICATION APPARATUS

(71) Applicant: Murata Manufacturing Co., Ltd., Kyoto (JP)

(72) Inventor: Yusuke Naniwa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/747,175

(22) Filed: Jan. 20, 2020

(65) Prior Publication Data

US 2020/0235772 A1    Jul. 23, 2020

(30) Foreign Application Priority Data

Jan. 21, 2019  (JP) .............................. JP2019-007780

(51) Int. Cl.
| | | |
|---|---|---|
| *H04B 1/40* | (2015.01) | |
| *H03F 3/19* | (2006.01) | |
| *H05K 1/02* | (2006.01) | |
| *H01F 17/00* | (2006.01) | |
| *H05K 1/11* | (2006.01) | |

(52) U.S. Cl.
CPC ........... *H04B 1/40* (2013.01); *H01F 17/0006* (2013.01); *H03F 3/19* (2013.01); *H05K 1/0243* (2013.01); *H05K 1/115* (2013.01); *H03F 2200/294* (2013.01); *H03F 2200/451* (2013.01); *H05K 2201/1003* (2013.01); *H05K 2201/1006* (2013.01)

(58) Field of Classification Search
CPC ........ H04B 1/40; H04B 1/005; H04B 1/0057; H04B 1/0067; H04B 1/04; H04B 1/16; H04B 1/006; H03F 3/19; H03F 2200/294; H03F 2200/451; H03F 2200/111; H03F 2203/7209; H03F 3/72; H03F 3/193; H03F 1/223; H05K 1/0243; H05K 2201/1006; H05K 2201/1003; H05K 1/165; H05K 1/185; H05K 2201/0715; H05K 2201/10545; H05K 2201/10166; H01F 17/0006
See application file for complete search history.

(56) References Cited

U.S. PATENT DOCUMENTS

| | | | | |
|---|---|---|---|---|
| 9,807,882 B1 | * | 10/2017 | Berdy ................... | H05K 1/181 |
| 2003/0060172 A1 | * | 3/2003 | Kuriyama ............ | H05K 1/0206 |
| | | | | 455/575.1 |
| 2003/0068998 A1 | * | 4/2003 | Yamakawa ............... | H01P 1/15 |
| | | | | 455/339 |

(Continued)

FOREIGN PATENT DOCUMENTS

| | | |
|---|---|---|
| JP | 2006-211612 A | 8/2006 |
| WO | 2014/017159 A1 | 1/2014 |
| WO | 2018/168653 A1 | 9/2018 |

*Primary Examiner* — Andrew Wendell
(74) *Attorney, Agent, or Firm* — Pearne & Gordon LLP

(57) ABSTRACT

A front-end module includes a module board, a reception filter mounted on the module board, a reception low-noise amplifier mounted on the module board, and an inductor incorporated in the module board and connected to a path linking the reception filter and the reception low-noise amplifier. The inductor includes an inductor board. At least part of the inductor overlaps at least part of the reception low-noise amplifier in plan view.

15 Claims, 7 Drawing Sheets

(56) References Cited

U.S. PATENT DOCUMENTS

| | | | |
|---|---|---|---|
| 2007/0058748 A1* | 3/2007 | Kim | H04B 1/52 375/295 |
| 2009/0174497 A1* | 7/2009 | Korden | H03H 9/725 333/100 |
| 2010/0090781 A1* | 4/2010 | Yamamoto | H01L 27/016 333/167 |
| 2013/0163212 A1* | 6/2013 | Tanaka | H03H 9/0566 361/748 |
| 2015/0289360 A1* | 10/2015 | Leong | H01L 24/17 361/782 |
| 2016/0037640 A1* | 2/2016 | Takai | H01L 23/3107 361/753 |
| 2017/0077580 A1* | 3/2017 | Kawaguchi | H01P 5/028 |
| 2017/0133998 A1* | 5/2017 | Hino | H03H 9/46 |
| 2017/0141752 A1* | 5/2017 | Hino | H04B 1/525 |
| 2017/0359097 A1* | 12/2017 | Uchida | H01L 28/10 |
| 2019/0334564 A1* | 10/2019 | Gorbachov | H03F 3/24 |
| 2020/0007174 A1 | 1/2020 | Watanabe | |

* cited by examiner

FRONT-END MODULE AND COMMUNICATION APPARATUS

This application claims priority from Japanese Patent Application No. 2019-007780 filed on Jan. 21, 2019. The content of this application is incorporated herein by reference in its entirety.

BACKGROUND

The present disclosure relates to a front-end module and a communication apparatus including the front-end module. In mobile communications equipment, such as cellular phones, in particular, with the progress of multiband technology, the number of circuit devices constituting a high-frequency front-end circuit is increased, and this makes it difficult to miniaturize the front-end module.

International Publication No. 2018/168653 discloses a front-end module miniaturized by using a board of the double-sided mounting type.

Still, more miniaturization of the front-end module is desired. In addition, suppression of degradation in quality of transmission and reception signals caused by the miniaturization is also desired.

BRIEF SUMMARY

The present disclosure is made to solve the above-described problems. Accordingly, the present disclosure provides a front-end module capable of suppressing degradation in quality of transmission and reception signals and capable of achieving its miniaturization.

According to embodiments of the present disclosure, a front-end module includes a first board, a filter mounted on the first board, an amplifier circuit mounted on the first board, and a first inductor incorporated in the first board and connected to a path linking the filter and the amplifier circuit. The first inductor includes a second board. At least part of the first inductor overlaps at least part of the amplifier circuit in plan view.

The present disclosure can suppress degradation in quality of transmission and reception signals and achieve miniaturization of the front-end module.

Other features, elements, characteristics and advantages of the present disclosure will become more apparent from the following detailed description of embodiments of the present disclosure with reference to the attached drawings.

DETAILED DESCRIPTION

Figure 1:
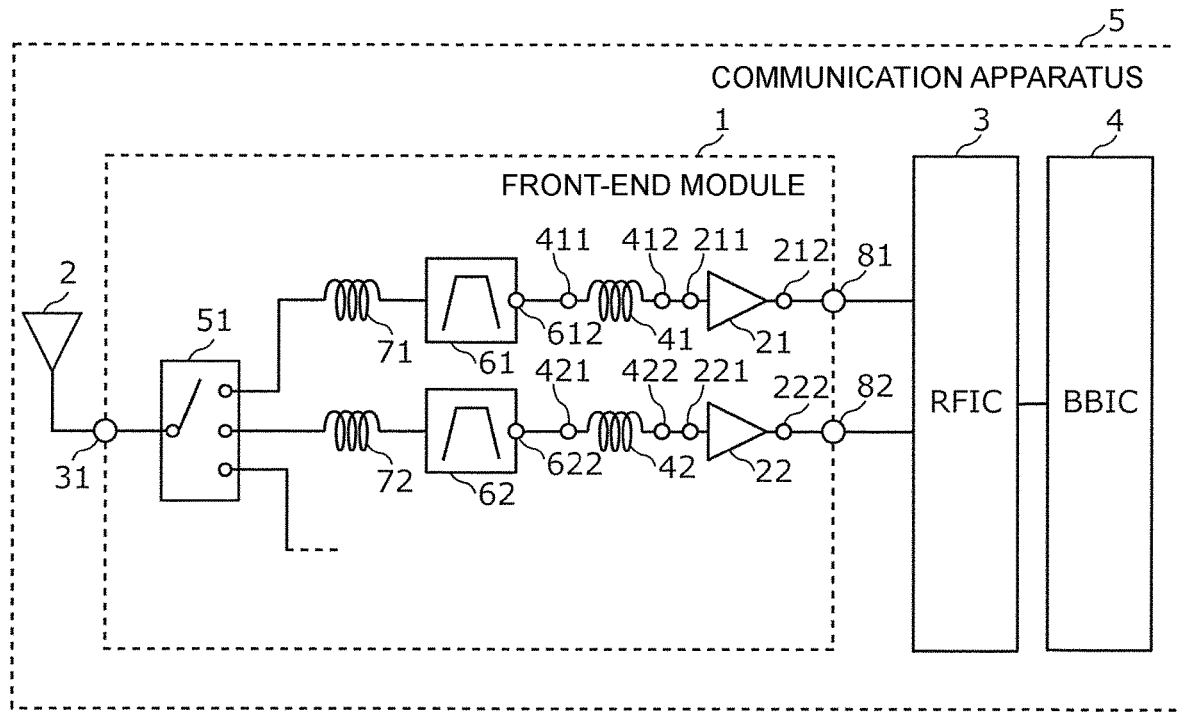
FIG. 1 is a circuit configuration diagram of a front-end module and a communication apparatus according to an embodiment.

An embodiment and its variations of the present disclosure are described in detail below with reference to the drawings. Each of the embodiment and its variations described below indicates a comprehensive or specific example. Numeric values, shapes, materials, elements, arrangement of the elements, connection forms thereof, and the like illustrated in the embodiment and its variations are examples and are not intended to limit the present disclosure. Among the elements in the embodiment and its variations described below, elements not described in the independent claims are described as optional elements.

The drawings are diagrams on which enhancement, omission, or adjustment of proportion is performed to illustrate the present disclosure, they are not necessarily strict illustrations, and they may be different from real shapes, positional relationships, and proportions. In the drawings, the same reference numerals are used in substantially the same configurations, and common description may be omitted or simplified.

In the drawings, the X axis and Y axis are axes orthogonal to each other on a plane parallel with a principal surface of a module board. The Z axis is an axis perpendicular to the principal surface of the module board, its positive direction indicates the upward direction, and its negative direction indicates the downward direction.

In the present disclosure, "directly connected" means directly connected by a connection terminal and/or wiring conductor without necessarily another circuit device interposed therebetween, and "connected" includes not only a case where something is directly connected by a connection terminal and/or wiring conductor but also a case where something is electrically connected with another circuit device interposed therebetween.

In the present disclosure, terms indicating relationships between elements, including parallel and perpendicular, terms indicating shapes, including rectangular, and numerical ranges indicate not only strict senses and also include substantially equivalent ranges with a difference of, for example, about several percent.

In the present disclosure, "in plan view" means being viewed in a direction perpendicular to the principal surface of the module board.

Embodiment

An embodiment is described with reference to FIGS. 1 to 7.

[1.1 Circuit Configuration of Front-End Module 1 and Communication Apparatus 5]

First, a circuit configuration of a front-end module 1 and a communication apparatus 5 according to the present embodiment is specifically described with reference to FIG. 1.

FIG. 1 is a circuit diagram of the front-end module 1 and communication apparatus 5 according to the embodiment. As illustrated in FIG. 1, the communication apparatus 5 includes the front-end module 1, an antenna device 2, an RF-signal processing circuit (RFIC) 3, and a baseband signal processing circuit (BBIC) 4.

The front-end module 1 transports high-frequency signals between the antenna device 2 and RFIC 3. One example of the front-end module 1 may be an integrated module in which various functional components used in a wireless front-end circuit for, for example, long term evolution (LTE), Wi-Fi (registered trademark), Bluetooth (registered trademark), and global positioning system (GPS) are integrated. The front-end module according to the present disclosure is not limited to the above-described example.

The antenna device 2 is connected to a common terminal 31 of the front-end module 1 and is configured to receive high-frequency signals from the outside and to output them to the front-end module 1.

The RFIC 3 is an RF-signal processing circuit configured to process high-frequency signals received at the antenna device 2 and to be transmitted from the antenna device 2. Specifically, the RFIC 3 is configured to perform signal-processing by down-converting or the like on high-frequency signals input through reception output terminals 81 and 82 in the front-end module 1 and then transported thereto and to output reception signals produced by the signal-processing to the BBIC 4.

The BBIC 4 is a circuit configured to perform signal-processing by using an intermediate frequency lower than that of a high-frequency signal propagating in the front-end module 1. An example signal processed by the BBIC 4 may be used as an image signal for displaying an image or used as an audio signal for conversation through a loudspeaker.

The antenna device 2 and BBIC 4 are optional elements for the communication apparatus according to the present disclosure.

Here, the configuration of the front-end module 1 is described in detail. In the present embodiment, the front-end module 1 constitutes a reception circuit for high-frequency signals.

As illustrated in FIG. 1, the front-end module 1 includes the common terminal 31, the reception and output terminals 81 and 82, reception low-noise amplifiers 21 and 22, reception filters 61 and 62, inductors 41, 42, 71, and 72, and a switch 51.

The common terminal 31 is connected to the antenna device 2.

Each of the reception low-noise amplifiers 21 and 22 is an example of an amplifier circuit and is configured to amplify a high-frequency signal input from the antenna device 2 through the reception filter 61 or 62 in a low-noise manner.

The reception low-noise amplifier 21 includes an input terminal 211 and an output terminal 212. A high-frequency signal input from the input terminal 211 is amplified by the reception low-noise amplifier 21 and is then output from the reception output terminal 81 through the output terminal 212.

The reception low-noise amplifier 22 includes an input terminal 221 and an output terminal 222. A high-frequency signal input from the input terminal 221 is amplified by the reception low-noise amplifier 22 and is then output from the reception output terminal 82 through the output terminal 222.

The reception filter 61 is an example of a filter and is arranged in a reception path linking the reception low-noise amplifier 21 and the common terminal 31. The reception filter 61 allows a high-frequency signal in a reception range of a first communication band among high-frequency signals input from the common terminal 31 to pass therethrough.

The reception filter 62 is an example of the filter and is arranged in a reception path linking the reception low-noise amplifier 22 and the common terminal 31. The reception filter 62 allows a high-frequency signal in a reception range of a second communication band, which is different from the first communication band, among the high-frequency signals input from the common terminal 31 to pass therethrough.

Examples of each of the reception filters 61 and 62 may include, but not limited to, a surface acoustic wave filter, an acoustic wave filter using a bulk acoustic wave (BAW), a piezoelectric thin-film bulk acoustic resonator (FBAR) filter, an LC resonant filter, and a dielectric filter.

The inductor 41 is an example of a first inductor and is connected in a path linking the reception low-noise amplifier 21 and the reception filter 61. The inductor 41 constitutes a matching circuit configured to achieve impedance matching between the reception low-noise amplifier 21 and the reception filter 61. Here, the inductor 41 is directly connected to the reception low-noise amplifier 21 and the reception filter 61. The inductor 41 includes an input terminal 411 and an output terminal 412.

The inductor 42 is an example of the first inductor and is connected in a path linking the reception low-noise amplifier 22 and the reception filter 62. The inductor 42 constitutes a matching circuit configured to achieve impedance matching between the reception low-noise amplifier 22 and the reception filter 62. Here, the inductor 42 is directly connected to the reception low-noise amplifier 22 and the reception filter 62. The inductor 42 includes an input terminal 421 and an output terminal 422.

The switch 51 is arranged in a path linking the common terminal 31 and the reception filters 61 and 62 and is configured to switch connection between the common terminal 31 and each of the reception filters 61 and 62 between conduction and nonconduction. More specifically, the switch 51 is configured to switch (1) connection between the common terminal 31 and the reception filter 61, (2) connection between the common terminal 31 and the reception filter 62, and (3) connection between the common terminal 31 and another reception filter (not illustrated). The switch 51 may be formed of a switch circuit configured to perform only one of the above-described (1) to (3) connections and may also be a switch circuit of the multiple-connection type, which can simultaneously establish two or more of the above-described (1) to (3) connections.

The control of the switch 51 may be conducted by the RFIC 3 or BBIC 4. A control circuit configured to control the switch 51 (not illustrated) may be included in the front-end module 1.

The inductor 71 is connected to a path linking the switch 51 and the reception filter 61. The inductor 71 constitutes a matching circuit configured to achieve impedance matching between the antenna device 2 and switch 51 and the reception filter 61.

The inductor 72 is connected to a path linking the switch 51 and the reception filter 62. The inductor 72 constitutes a matching circuit configured to achieve impedance matching between the antenna device 2 and switch 51 and the reception filter 62.

The switch 51, the inductors 71 and 72, the reception filter 62, the inductor 42, and the reception low-noise amplifier 22 are optional elements for the front-end module according to the present disclosure. That is, the front-end module according to the present disclosure includes at least the reception filter 61, the inductor 41, and the reception low-noise amplifier 21.

[1.2 Circuit Configuration of Low-Noise Amplifier 21]

Figure 2:
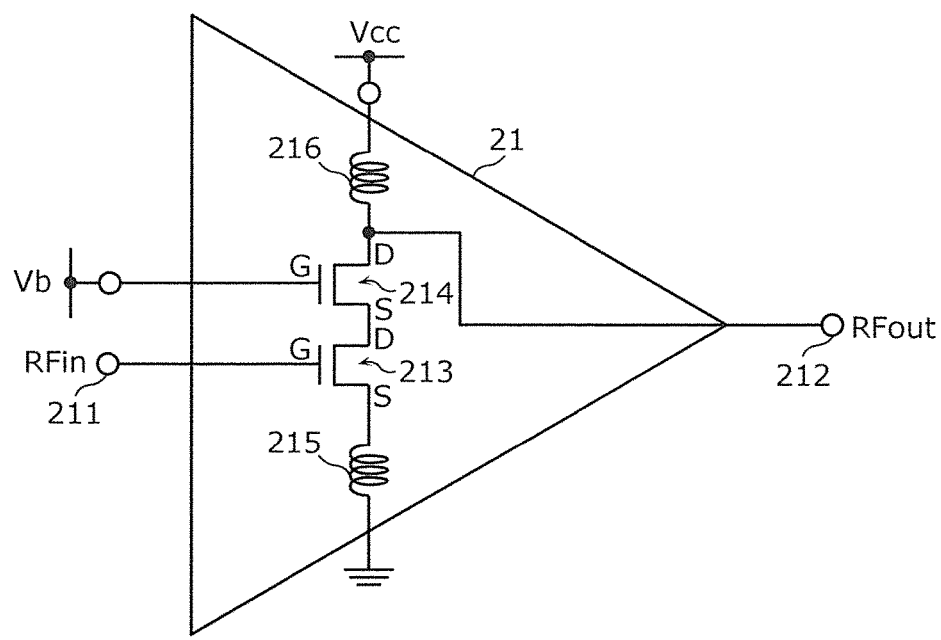
FIG. 2 is a circuit configuration diagram of a reception low-noise amplifier included in the front-end module according to the embodiment.

Next, a circuit configuration of the reception low-noise amplifier 21 is specifically described with reference to FIG. 2. FIG. 2 is a circuit configuration diagram of the reception low-noise amplifier 21 included in the front-end module 1 according to the embodiment. The low-noise amplifier 22 has substantially the same circuit configuration as that of the reception low-noise amplifier 21, and thus, the illustration and description of the circuit configuration of the reception low-noise amplifier 22 is omitted here.

The reception low-noise amplifier 21 is formed of a so-called cascode circuit and includes the input terminal 211, the output terminal 212, a source inductor 215, a choke inductor 216, and transistors 213 and 214.

Each of the transistors 213 and 214 is a field-effect transistor having a gate (G), a source (S), and a drain (D).

The gate of the transistor 213 is connected to the input terminal 211. The source of the transistor 213 is connected through the source inductor 215 to the ground. The drain of the transistor 213 is connected to the source of the transistor 214. In the transistor 213, the gate functions as the input side, and the drain functions as the output side.

The gate of the transistor 214 is connected to a terminal to which a bias voltage Vb is applied. The source of the transistor 214 is connected to the drain of the transistor 213. The drain of the transistor 214 is connected through the choke inductor 216 to a terminal to which a power supply voltage Vcc is applied and is also connected to the output terminal 212. In the transistor 214, the source functions as the input side, and the drain functions as the output side.

The source inductor 215 and the choke inductor 216 are an example of at least one second inductor. The source inductor 215 is connected between the ground and the source of the transistor 213. The choke inductor 216 is connected between the terminal to which the power supply voltage Vcc is applied and the drain of the transistor 214.

The above-described reception low-noise amplifier 21 is configured to amplify a high-frequency signal RFin input from the input terminal 211 and to output it as a high-frequency signal RFout from the output terminal 212.

The circuit configuration of the reception low-noise amplifier 21 does not need to be limited to the configuration illustrated in FIG. 2. For example, the transistors 213 and 214 may be bipolar transistors. The reception low-noise amplifier 21 may further include, for example, another circuit device (e.g., capacitor).

[1.3 Arrangement Configuration of Circuit Devices Inside Front-End Module 1]

Next, an arrangement configuration of circuit devices constituting the front-end module 1 is specifically described with reference to FIGS. 3 to 5.

Figure 3:
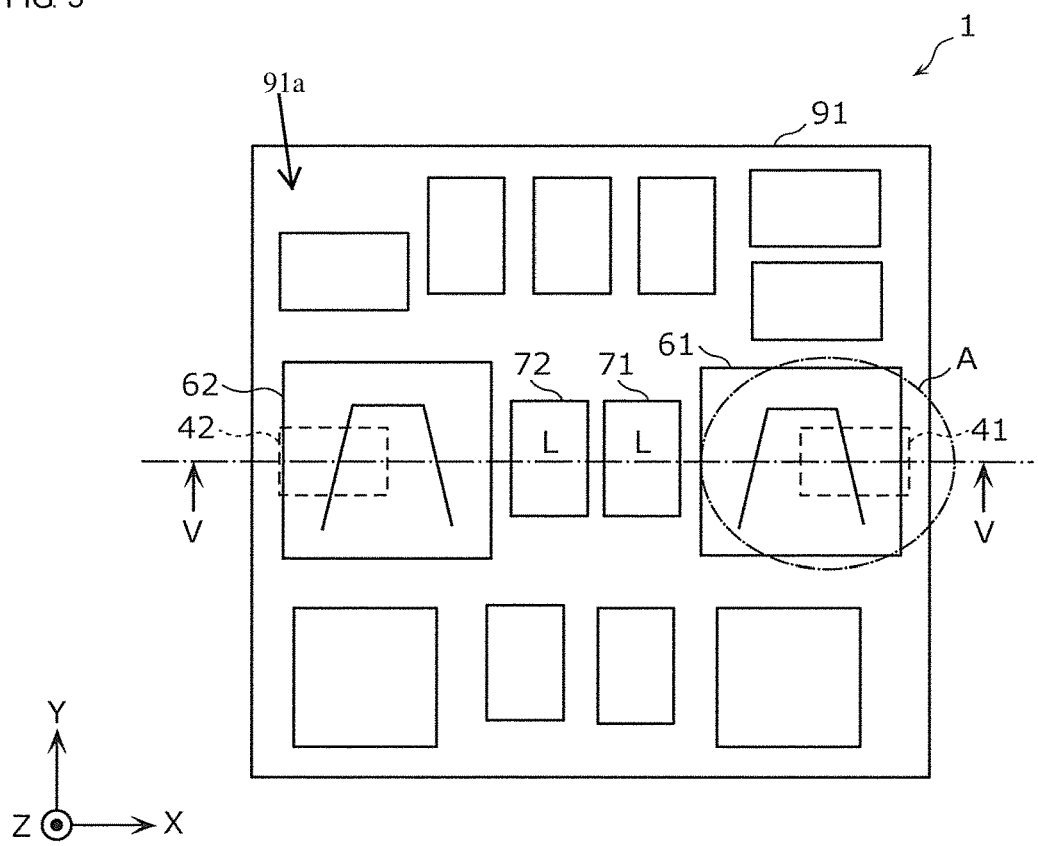
FIG. 3 is a plan view of the front-end module according to the embodiment.

FIG. 3 is a plan view of the front-end module 1 according to the embodiment. FIG. 4 is a bottom view of the front-end module 1 according to the embodiment. FIG. 5 is a cross-sectional view of the front-end module 1 according to the embodiment. Specifically, FIG. 5 is a cross-sectional view of the front-end module 1 taken along a cut line V-V in FIGS. 3 and 4.

Figure 4:
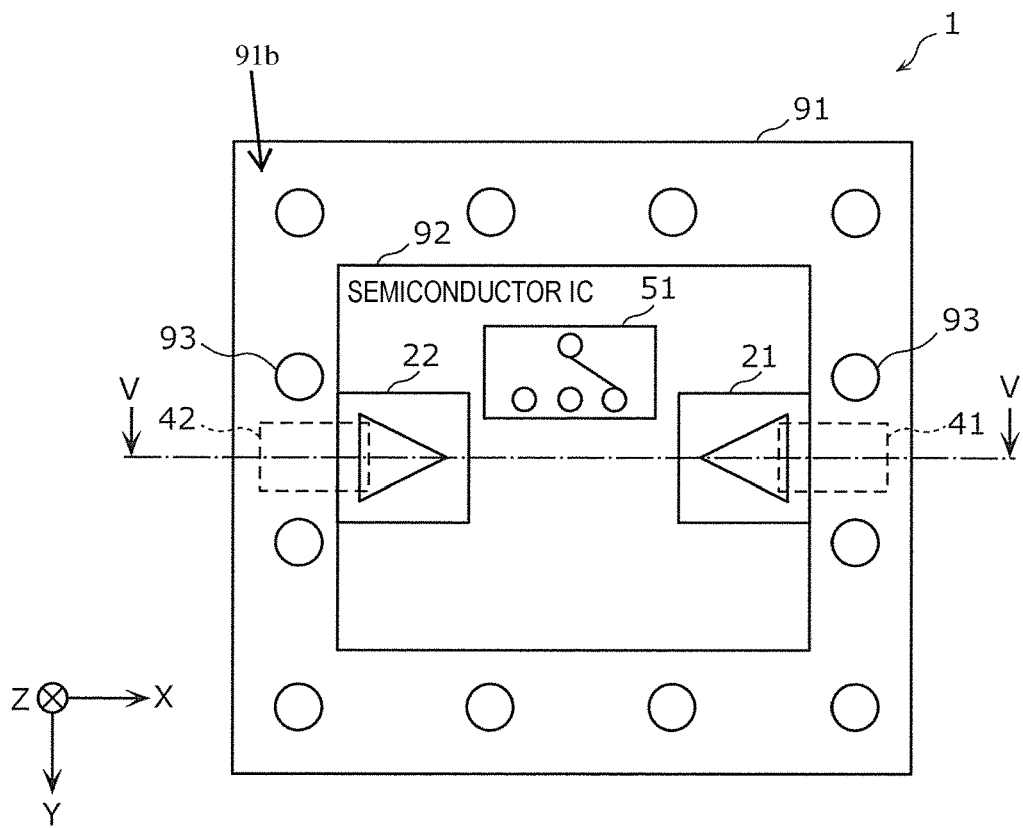
FIG. 4 is a bottom view of the front-end module according to the embodiment.

In FIGS. 3 and 4, a resin member 94 and a shield electrode layer 95 are omitted. The broken lines indicate components not seen from the surface.

Figure 5:
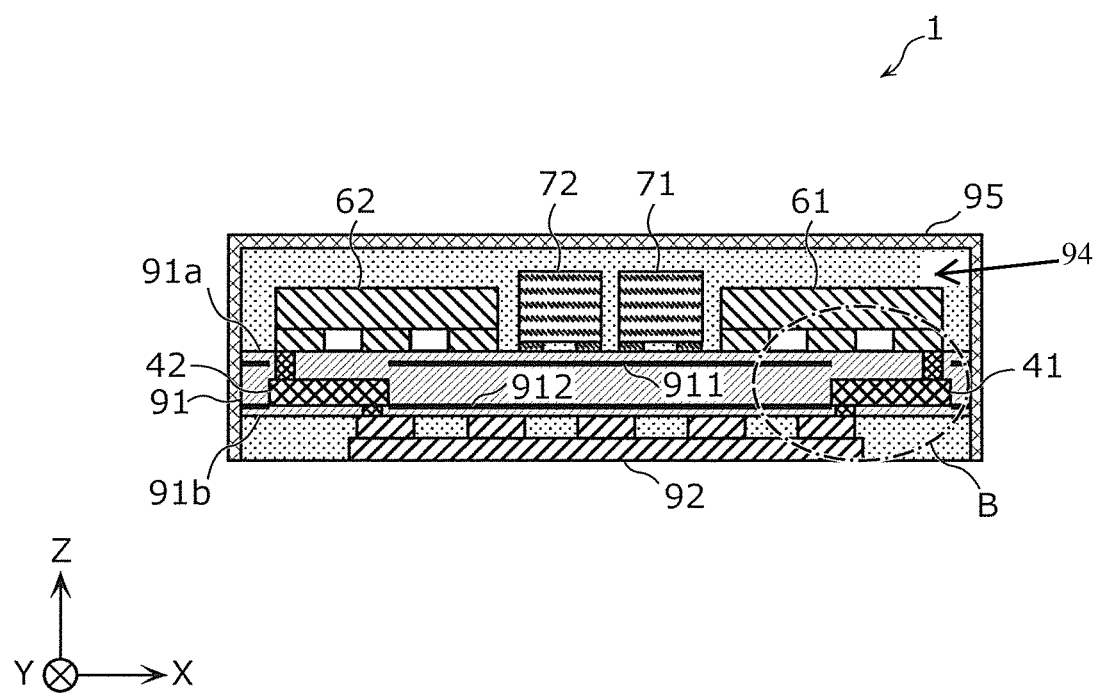
FIG. 5 is a cross-sectional view of the front-end module according to the embodiment.

As illustrated in FIGS. 3 to 5, the front-end module 1 includes, in addition to the circuit devices illustrated in FIGS. 1 and 2, a module board 91, a semiconductor IC 92, post electrodes 93, the resin member 94, the shield electrode layer 95, and other circuit devices (without reference numerals).

The module board 91 is an example of a first board. As the module board 91, for example, a printed circuit board (PCB), a low temperature co-fired ceramics (LTCC) board, a resin multilayer board, or the like may be used.

The module board 91 includes a principal surface 91a and a principal surface 91b, which are opposed to each other. The principal surfaces 91a and 91b may also be referred to the upper surface and the lower surfaces, respectively. In the present embodiment, the above-described reception circuit, except for the inductors 41 and 42, is mounted on the principal surfaces 91a and 91b of the module board 91.

Specifically, the reception filters 61 and 62 and the inductors 71 and 72 are mounted on the principal surface 91a of the module board 91. The reception low-noise amplifiers 21 and 22 are mounted on the principal surface 91b of the module board 91. The inductors 41 and 42 are incorporated in the module board 91.

In addition to the inductors 41 and 42, planar ground patterns 911 and 912 set at a ground potential are arranged inside the module board 91. The planar ground patterns 911 and 912 extend over different planes parallel with the principal surfaces 91a and 91b of the module board 91.

The semiconductor IC 92 is an integrated circuit. For example, the semiconductor IC 92 may be formed of the reception low-noise amplifiers 21 and 22 and the switch 51. The semiconductor IC 92 is mounted on the principal surface 91b of the module board 91.

The post electrodes 93 extend from the principal surface 91b of the module board 91. Each of the post electrodes 93 passes through the resin member 94 to connect the module board 91 and an external board (not illustrated), and its end is exposed from the resin member 94. One example of the external board may be a mother board arranged on the negative Z-axis direction side of the front-end module 1. The front-end module 1 exchanges electric signals with the external board via the plurality of post electrodes 93. Some of the plurality of post electrodes 93 are set at the ground potential of the external board.

The post electrodes 93 are positioned around the edge of the rectangular module board 91 such that they surround the semiconductor IC 92. That is, the plurality of post electrodes 93 include three or more post electrodes aligned in the X direction and three or more post electrodes aligned in the Y direction.

Each of the post electrodes 93 may not be columnar, and its shape is not limited. That is, the post electrode 93 may be a simple electrode, a solder ball, or a copper core ball.

The resin member 94 covers the above-described reception circuit and the principal surfaces 91a and 91b of the module board 91. The resin member 94 has the function of achieving sufficient reliability of the mechanical strength, moisture resistance, and the like of the circuit devices constituting the above-described reception circuit.

The shield electrode layer 95 covers the upper surface and side surface of the resin member 94 and is connected to the planar ground patterns 911 and 912 inside the module board 91 at the side surface of the module board 91. The shield electrode layer 95 can suppress the entry of external noise into the circuit devices constituting the front-end module 1.

The post electrodes 93, the resin member 94, the shield electrode layer 95, and the planar ground patterns 911 and 912 are optional elements for the front-end module according to the present disclosure.

[1.4 Configuration and Arrangement of Inductor 41]

Figure 6:
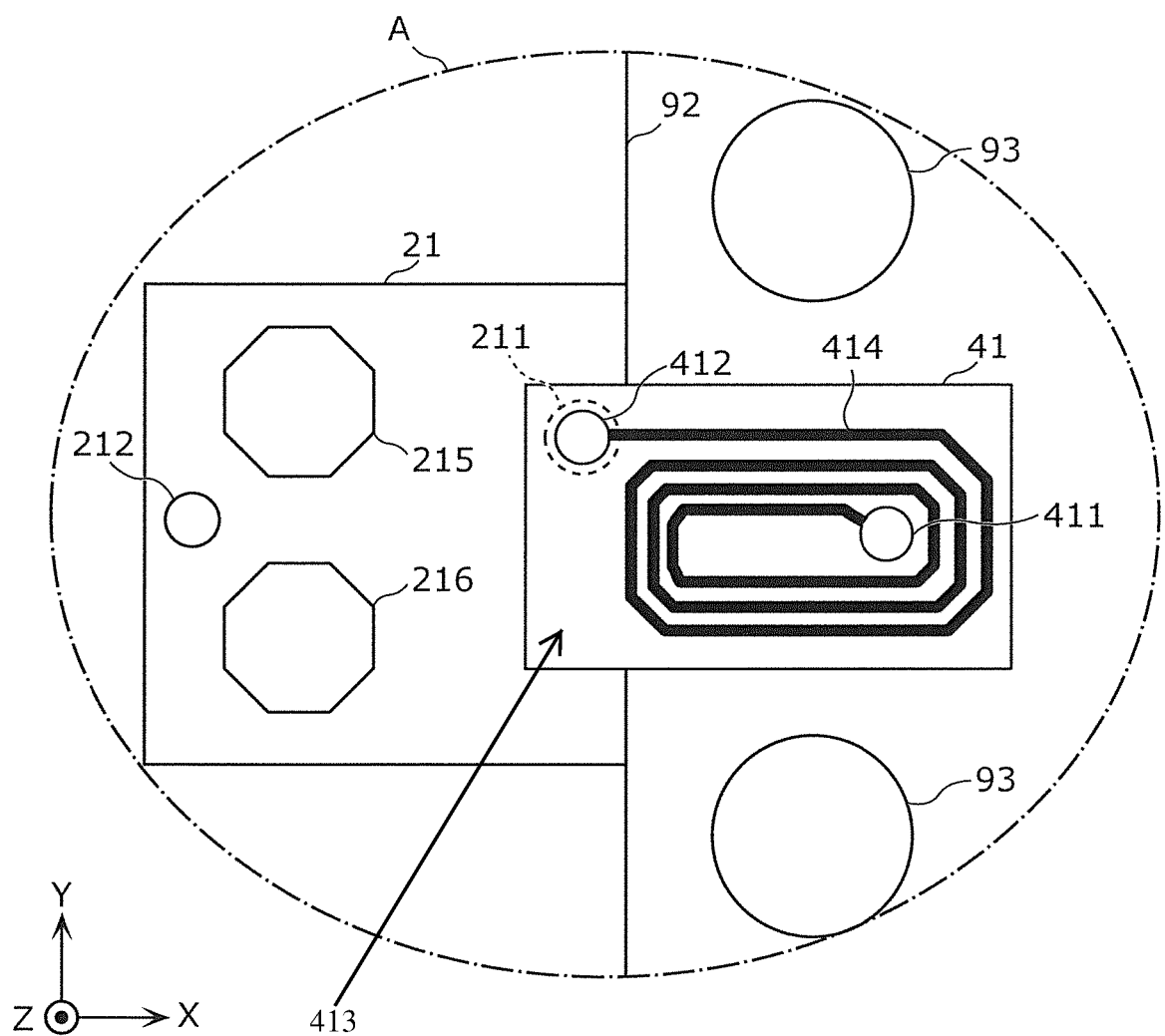
FIG. 6 is an enlarged plan view of an inductor and its surroundings included in the front-end module according to the embodiment.
Figure 7:
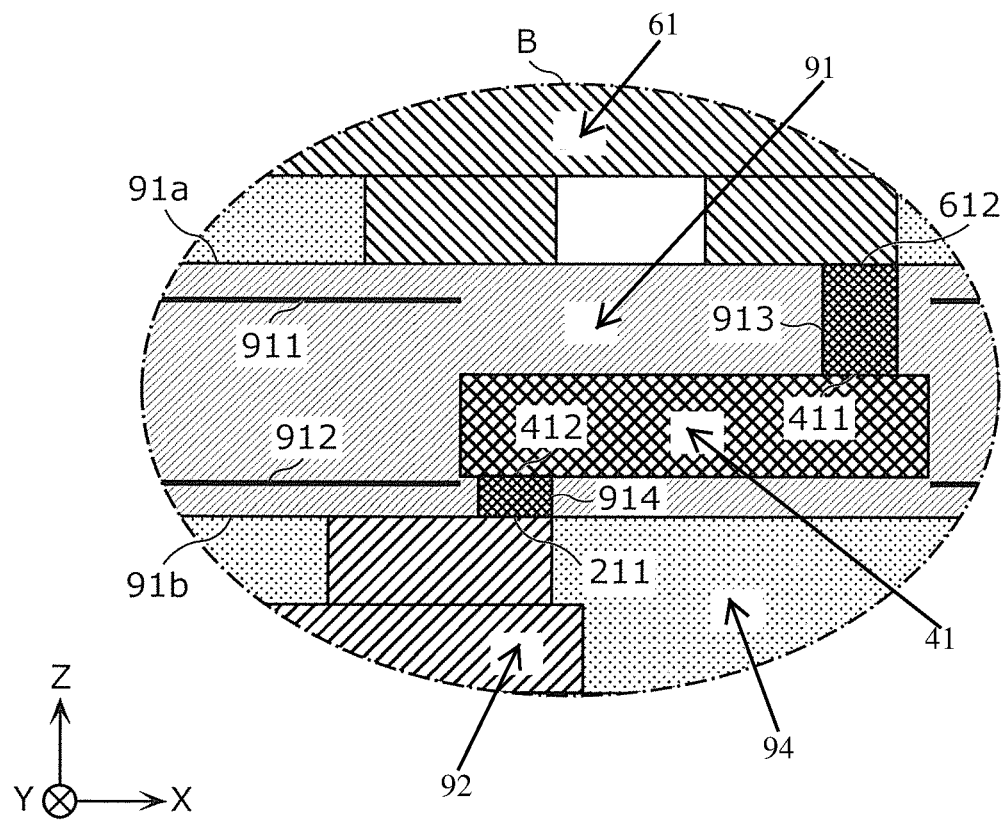
FIG. 7 is an enlarged cross-sectional view of the inductor and its surroundings included in the front-end module according to the embodiment.

Here, a configuration and arrangement of the inductor 41 incorporated in the module board 91 is specifically described with reference to FIGS. 6 and 7. FIG. 6 is an enlarged plan view of the inductor 41 and its surroundings included in the front-end module 1 according to the embodiment. FIG. 7 is an enlarged cross-sectional view of the inductor 41 and its surroundings included in the front-end module 1 according to the embodiment. In FIG. 6, in addition to the resin member 94 and the shield electrode layer 95, the module board 91 and the circuit devices mounted on the principal surface 91a of the module board 91 are omitted.

The inductor 42 has substantially the same configuration and arrangement as that of the inductor 41. Accordingly, the illustration and description of the configuration and arrangement of the inductor 42 is omitted here.

The inductor 41 may be realized as, for example, an integrated passive device (IPD). The inductor being the IPD may also be referred to as a film-type inductor or thin-film inductor. Here, the inductor 41 is incorporated in the module board 91 by being embedded in a cavity inside the module board 91.

As illustrated in FIGS. 6 and 7, the inductor 41 includes the input terminal 411, the output terminal 412, an inductor board 413, and a coil conductor 414.

The input terminal 411 is connected to an output terminal 612 of the reception filter 61 in the Z direction, which is perpendicular to the principal surface of the module board 91, by a via conductor 913. That is, the input terminal 411 of the inductor 41 and the output terminal 612 of the reception filter 61 are connected to each other by only the via conductor 913, without necessarily the planar wiring pattern interposed therebetween. The via conductor 913 is an example of a first via conductor and is a conductor with which a blind via hole in the principal surface 91a of the module board 91 is filled. The input terminal 411 may be connected to the output terminal 612 with both the planar wiring pattern and the via conductor interposed therebetween.

The output terminal 412 is connected to the input terminal 211 of the reception low-noise amplifier 21 in the Z direction, which is perpendicular to the principal surface of the module board 91, by a via conductor 914. That is, the output terminal 412 of the inductor 41 and the input terminal 211 of the reception low-noise amplifier 21 are connected to each other by only the via conductor 914, without necessarily the planar wiring pattern interposed therebetween. The via conductor 914 is an example of a second via conductor and is a conductor with which a blind via hole in the principal surface 91b of the module board 91 is filled. The output terminal 412 may be connected to the input terminal 211 with both the planar wiring pattern and the via conductor interposed therebetween.

The inductor board 413 is an example of a second board. The inductor board 413 is arranged in parallel with the module board 91 inside the module board 91. In the present embodiment, the material of the inductor board 413 differs from that of the module board 91, and the inductor board 413 has permittivity different from that of the module board 91. As the inductor board 413, for example, a silicon board can be used. When the silicon board is used as the inductor board 413, the inductor 41 having a higher Q value with a smaller size can be achieved, in comparison with the case where a PCB is used. The Q value is a value of a quality factor being a ratio of inductive reactance to resistance.

The coil conductor 414 is arranged on a path linking the input terminal 411 and output terminal 412. The coil conductor 414 is a spiral planar pattern parallel with the principal surface of the inductor board 413. The coil conductor 414 may be formed on the inductor board 413 by, for example, photolithography.

As illustrated in FIG. 6, at least part of the inductor 41 overlaps at least part of the reception low-noise amplifier 21 in plan view. Specifically, the output terminal 412 of the inductor 41 overlaps the input terminal 211 of the reception low-noise amplifier 21 in plan view. That is, the output terminal 412 of the inductor and the input terminal 211 of the reception low-noise amplifier 21 overlap each other in the Z direction.

The coil conductor 414 of the inductor 41 overlaps neither the source inductor 215 nor the choke inductor 216 in the reception low-noise amplifier 21 and also neither the planar ground pattern 911 nor 912 in plan view. That is, the coil conductor 414 does not overlap the region of the semiconductor IC 92 where the source inductor 215 and the choke inductor 216 are disposed in the Z direction and also does not overlap the region of the module board 91 where the planar ground patterns 911 and 912 are disposed in the Z direction.

Furthermore, the coil conductor 414 in the inductor 41 overlaps none of the plurality of post electrodes 93 in plan view. In particular, the inductor 41 is arranged between two neighboring post electrodes among the three or more post electrodes aligned in the Y direction.

[1.5 Advantages and the Like]

As described above, in the front-end module 1 according to the present embodiment, the inductor 41 can be incorporated in the module board 91. Accordingly, the area where the components are mounted on the principal surfaces of the module board 91 can be reduced, and the front-end module 1 can be miniaturized.

In the front-end module 1 according to the present embodiment, at least part of the inductor 41 can overlap at least part of the reception low-noise amplifier 21 in plan view. Accordingly, the inductor 41 inside the module board 91 and the reception low-noise amplifier 21 on the module board 91 can be connected in a direction perpendicular to the principal surfaces of the module board 91 (i.e., Z direction) by a distance less than the thickness of the module board 91, and the length of the wiring between the inductor 41 and the reception low-noise amplifier 21 can be shortened. This results in a reduced parasitic capacitance of the wiring between the inductor 41 and the reception low-noise amplifier 21, and degradation in characteristics (e.g., gain and/or noise figure) of the reception low-noise amplifier 21 caused by the parasitic capacitance can be suppressed.

In the front-end module 1 according to the present embodiment, because the inductor 41 includes the inductor board 413, a board made of a material different from that of the module board 91 can be used as the inductor board 413. Accordingly, a board made of a material suited for the inductor 41 can also be used as the inductor board 413, and a decrease in the Q value of the inductor 41 caused by the incorporation into the module board 91 can be suppressed.

Thus, because the inductor 41 including the inductor board 413 is incorporated in the module board 91 and at least part of the inductor 41 overlaps the reception low-noise amplifier 21 in plan view, the front-end module 1 can suppress the degradation in the quality of reception signals and can be miniaturized.

In the front-end module 1 according to the present embodiment, overlapping of the coil conductor 414 of the inductor 41 and each of the source inductor 215 and the choke inductor 216 in the reception low-noise amplifier 21 in plan view can be avoided. Accordingly, a decrease in the Q value of the inductor 41 caused by magnetic flux generated by the source inductor 215 and the choke inductor 216 can be suppressed. In addition, an oscillation of the reception low-noise amplifier 21 caused by interference between the coil conductor 414 in the inductor 41 and each of the source inductor 215 and choke inductor 216 can be suppressed.

In the front-end module 1 according to the present embodiment, overlapping of the coil conductor 414 in the inductor 41 and each of the planar ground patterns 911 and 912 in plan view can be avoided. Accordingly, a decrease in the Q value of the inductor 41 caused by the effect of the planar ground patterns 911 and 912 on a magnetic-field distribution of the inductor 41 can be suppressed.

In the front-end module 1 according to the present embodiment, overlapping of the inductor 41 and the post electrodes 93 in plan view can be avoided. Accordingly, when the post electrodes 93 are GND terminals, a decrease in the Q value of the inductor 41 caused by the effect of the post electrodes 93 on the magnetic-field distribution of the inductor 41 can be avoided. When the post electrodes 93 are RF terminals, degradation in the isolation characteristics can be suppressed.

In the front-end module 1 according to the present embodiment, the coil conductor 414 in the inductor 41 can be arranged between two neighboring post electrodes in plan view. Accordingly, areas where it is difficult to mount components can be effectively used, and the front-end module 1 can be further miniaturized.

In the front-end module 1 according to the present embodiment, the output terminal 612 of the reception filter 61 and the input terminal 411 of the inductor 41 can be connected to each other in the direction perpendicular to the principal surfaces of the module board 91 by the via conductor 913. Furthermore, the output terminal 412 of the inductor 41 and the input terminal 211 of the reception low-noise amplifier 21 can be connected to each other in the direction perpendicular to the principal surfaces of the module board 91 by the via conductor 914. Accordingly, the length of the wiring between the reception filter 61 and the inductor 41 and the length of the wiring between the inductor 41 and the reception low-noise amplifier 21 can be shortened, and the parasitic capacitance can be reduced. Therefore, degradation in the characteristics of the reception low-noise amplifier 21 caused by the parasitic capacitance can be suppressed.

(First Variation of Embodiment)

Next, a first variation of the embodiment is described. This variation differs from the above-described embodiment in that the principal surface where the reception filter is mounted and the principal surface where the semiconductor IC is mounted are exchanged. This variation is described below with reference to FIG. 8 mainly with the points different from the above-described embodiment.

Figure 8:
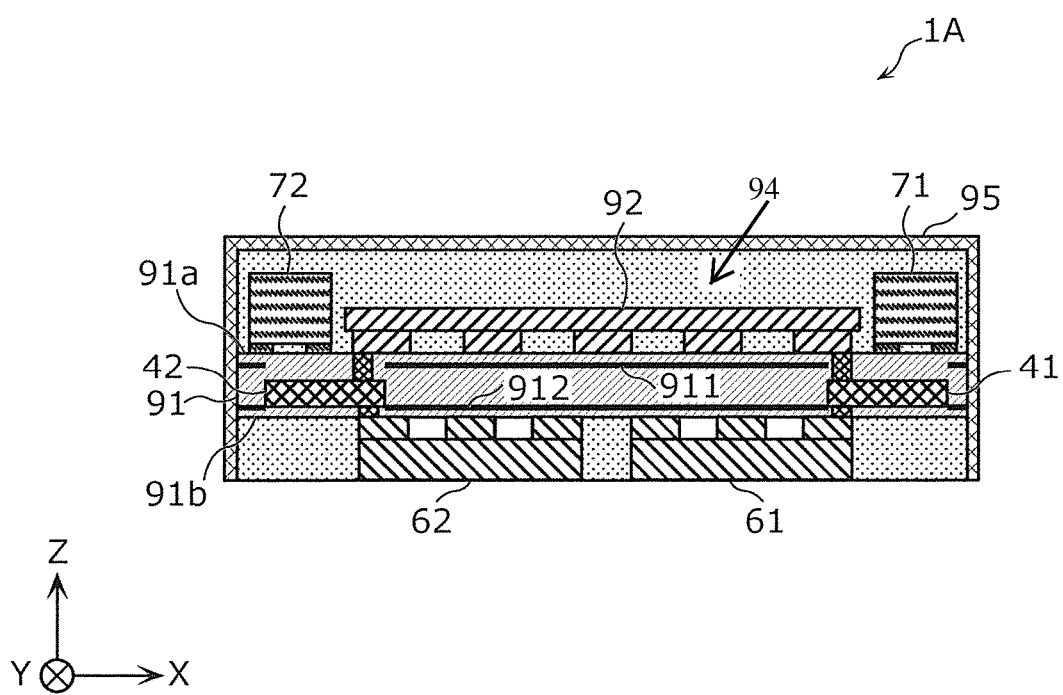
FIG. 8 is a cross-sectional view of a front-end module according to a first variation of the embodiment.

FIG. 8 is a cross-sectional view of a front-end module 1A according to the first variation of the embodiment. As illustrated in FIG. 8, the reception filters 61 and 62 according to the present variation are mounted on the principal surface 91b of the module board 91. That is, the reception filters 61 and 62 are mounted on the principal surface 91b (lower surface), where the plurality of post electrodes 93 are arranged.

The semiconductor IC 92 in the present variation is mounted on the principal surface 91a of the module board 91. That is, the semiconductor IC 92 is mounted on the principal surface 91a (upper surface), which is opposite to the principal surface 91b, where the plurality of post electrodes 93 are arranged.

As described above, in the front-end module 1A according to the present variation, in which the semiconductor IC 92 with the reception low-noise amplifiers 21 and 22 is mounted on the upper surface and the reception filters 61 and 62 are mounted on the lower surface, the inductor 41 with the inductor board 413 can be incorporated in the module board 91, and at least part of the inductor 41 can overlap the reception low-noise amplifier 21 in plan view. Accordingly, the front-end module 1A according to the present variation can also suppress degradation in the quality of reception signals and can be miniaturized, as in the case of the front-end module 1 according to the above-described embodiment.

(Second Variation of Embodiment)

Next, a second variation of the embodiment is described. This variation differs from the above-described embodiment in that the semiconductor IC is incorporated in the module board and the output terminal of the inductor and the input terminal of the reception low-noise amplifier are joined. This variation is described below with reference to FIG. 9 mainly with the points different from the above-described embodiment.

Figure 9:
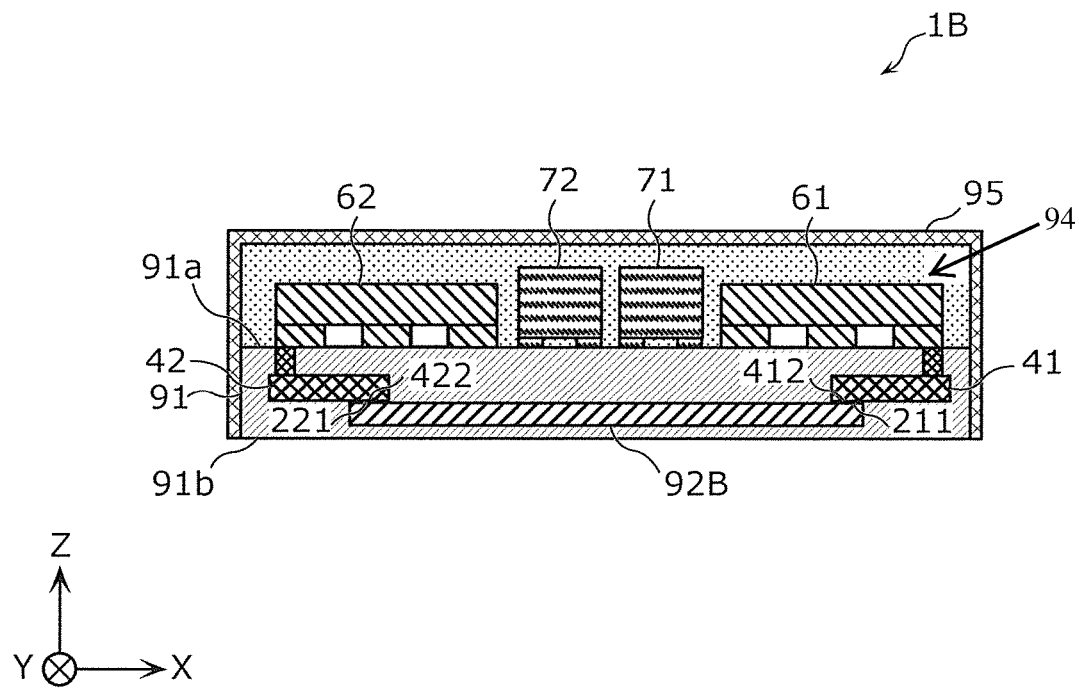
FIG. 9 is a cross-sectional view of a front-end module according to a second variation of the embodiment.

FIG. 9 is a cross-sectional view of a front-end module 1B according to the second variation of the embodiment. As illustrated in FIG. 9, a semiconductor IC 92B according to the present variation is incorporated in the module board 91. That is, the reception low-noise amplifiers 21 and 22 are incorporated in the module board 91.

Furthermore, the output terminal 412 of the inductor 41 is joined to the input terminal 211 of the reception low-noise amplifier 21. That is, the inductor 41 and the reception low-noise amplifier 21 are joined without necessarily the via conductor and planar wiring pattern interposed therebetween such that their terminals are joined together. Similarly, the output terminal 422 of the inductor 42 is joined to the input terminal 221 of the reception low-noise amplifier 22.

As described above, in the front-end module 1B according to the present variation, the semiconductor IC 92B with the reception low-noise amplifiers 21 and 22 can be incorporated in the module board 91. Accordingly, the area where components are mounted on the principal surface of the module board 91 can be reduced, and the front-end module 1B can be further miniaturized.

Furthermore, in the front-end module 1B according to the present variation, the output terminal 412 of the inductor 41 can be joined to the input terminal 211 of the reception low-noise amplifier 21. Accordingly, the length of the wiring between the inductor 41 and the reception low-noise amplifier 21 can be further shortened. Therefore, the parasitic capacitance of the wiring between the inductor 41 and the reception low-noise amplifier 21 can be reduced, and degradation in the characteristics of the reception low-noise amplifier 21 caused by the parasitic capacitance can be further suppressed.

(Third Variation of Embodiment)

Next, a third variation of the embodiment is described. This variation differs from the second variation in that the inductors connected between the switch and the reception filters are also incorporated in the module board. This variation is described below with reference to FIG. 10 mainly with the points different from the above-described embodiment and second variation.

Figure 10:
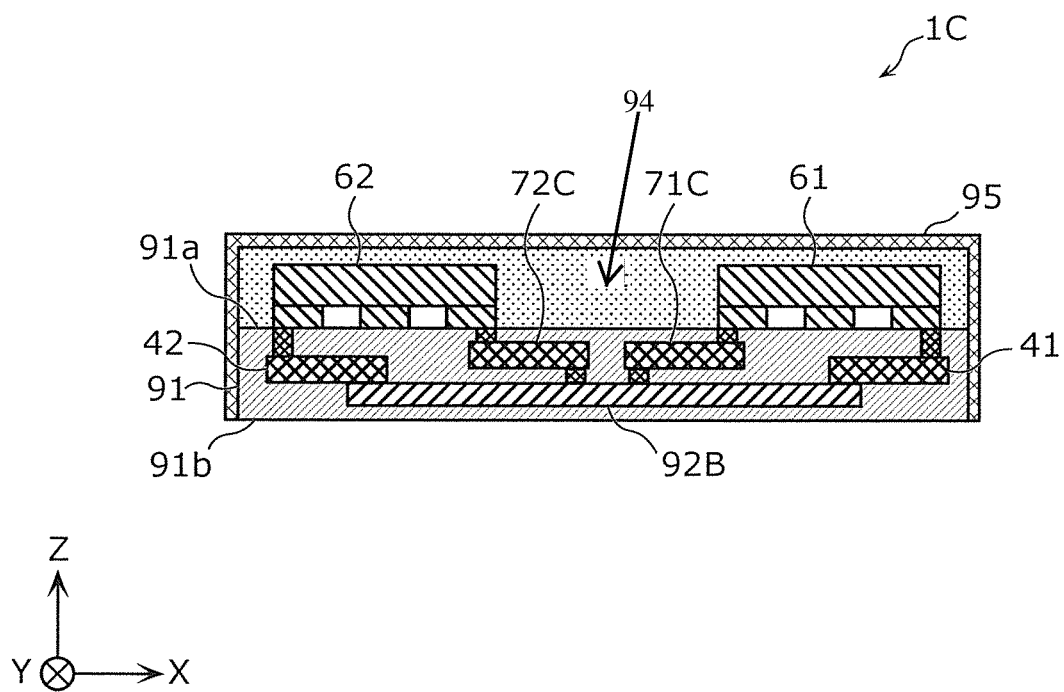
FIG. 10 is a cross-sectional view of a front-end module according to a third variation of the embodiment.

FIG. 10 is a cross-sectional view of a front-end module 1C according to the third variation of the embodiment. As illustrated in FIG. 10, inductors 71C and 72C according to the present variation are incorporated in the module board 91. The inductors 71C and 72C correspond to the inductors 71 and 72 in the above-described embodiment.

That is, the inductor 71C is connected to a path linking the switch 51 and the reception filter 61 and constitutes a matching circuit configured to achieve impedance matching between the antenna device 2 and switch 51 and the reception filter 61. The inductor 72C is connected to a path linking the switch 51 and the reception filter 62 and constitutes a matching circuit configured to achieve impedance matching between the antenna device 2 and switch 51 and the reception filter 62.

The inductors 71C and 72C may be realized as, for example, IPDs, as in the case of the inductors 41 and 42. The inductors 71C and 72C may also be, for example, multilayer inductors printed inside the module board 91. In this case, the inductor 71 may not include the inductor board.

As described above, in the front-end module 1C according to the present variation, in addition to the inductors 41 and 42, the inductors 71C and 72C can also be incorporated in the module board 91. Accordingly, the area where components are mounted on the principal surface of the module board 91 can be reduced, and the front-end module 1C can be further miniaturized. The inductors 71 and 72 are mounted on the principal surface of the module board 91 are typically higher than the reception filters 61 and 62, as illustrated in FIG. 5 and the like. Accordingly, when the inductors 71 and 72 are incorporated in the module board 91 and thus the inductors are removed from the region above the principal surface 91a of the module board 91, the profile of the front-end module IC can also be reduced.

(Fourth Variation of Embodiment)

Next, a fourth variation of the embodiment is described. This variation differs from the above-described embodiment in that the front-end module is a single-sided mounted module. This variation is described below with reference to FIG. 11 mainly with the points different from the above-described embodiment.

Figure 11:
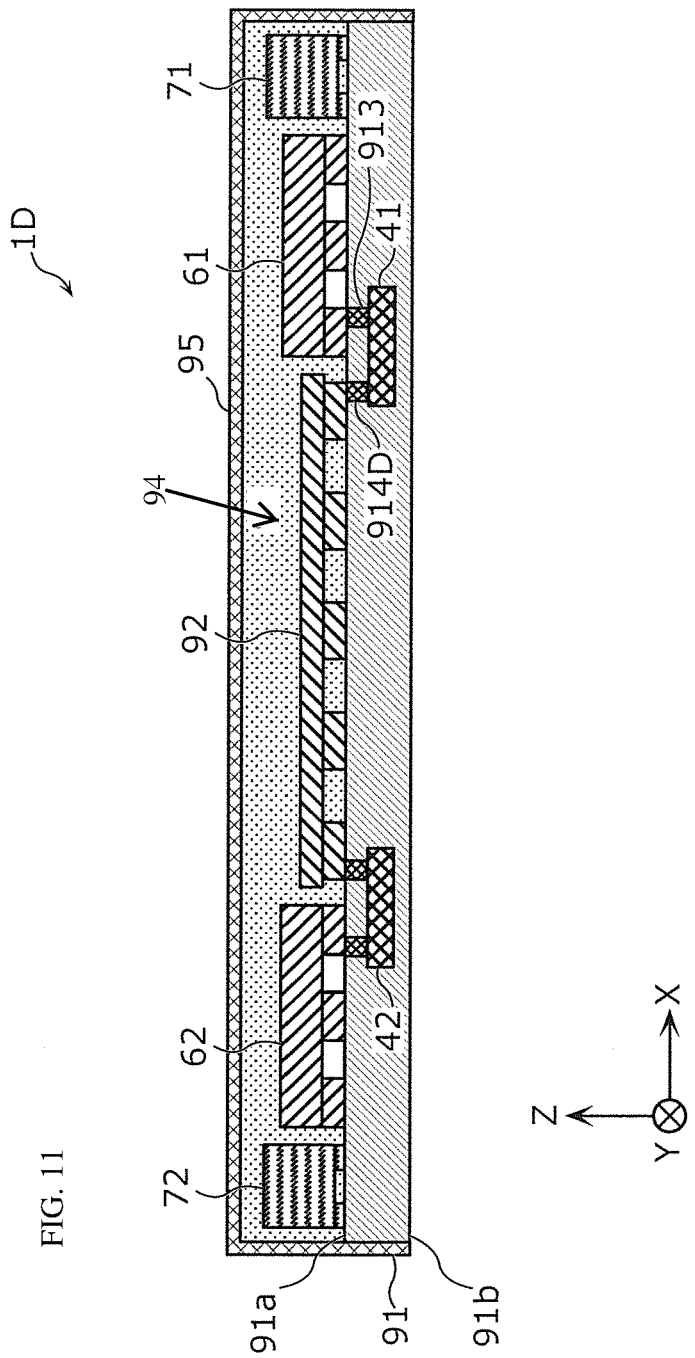
FIG. 11 is a cross-sectional view of a front-end module according to a fourth variation of the embodiment.

FIG. 11 is a cross-sectional view of a front-end module 1D according to the fourth variation of the embodiment. As illustrated in FIG. 11, in the present variation, the reception filters 61 and 62 and the semiconductor IC 92 are mounted on the same principal surface 91a. In this case, the reception filter 61 and the inductor 41 are connected to each other in the Z direction by the via conductor 913, as in the above cases. The inductor 41 and the reception low-noise amplifier 21 inside the semiconductor IC 92 are connected to each other in the Z direction by a via conductor 914D. The via conductors 913 and 914D are conductors with which blind via holes formed in the principal surface 91a of the module board 91 are filled.

As described above, in the front-end module 1D according to the present variation, in which the semiconductor IC 92 with the reception low-noise amplifiers 21 and 22 and the reception filters 61 and 62 are mounted on the same principal surface, the inductor 41 with the inductor board 413 can be incorporated in the module board 91, and at least part of the inductor 41 can overlap the reception low-noise amplifier 21 in plan view. Accordingly, the front-end module 1D according to the present variation can suppress degradation in quality of reception signals and can be miniaturized, as in the case of the front-end module 1 according to the above-described embodiment.

(Other Variations and the Like)

The front-end module and the communication apparatus according to the present disclosure are described above by using the embodiment and its variations. The front-end module and the communication apparatus according to the present disclosure are not limited to the above-described embodiment and its variations. The present disclosure includes other embodiments in which any elements in the above-described embodiment and its variations are combined, variations in which various changes that can be conceived by those skilled in the art are made to the above-described embodiment and its variations within a range that does not depart from the spirit of the present disclosure, and various kinds of equipment in which the above-described front-end module and communication apparatus are incorporated.

For example, in the front-end module and the communication apparatus according to the above-described embodiment and its variations, other circuit devices, wiring, and the like may also be inserted between paths connecting circuit devices and signal paths disclosed in the drawings. For example, the matching circuit, which is configured to achieve impedance matching between the reception low-noise amplifier and the reception filter and is formed of the inductor in the above-described embodiment and its variations, may also include other circuit devices (e.g., capacitor, resistor, and the like). In this case, the other circuit devices may also be mounted on the inductor board 413 in the inductor 41.

In the above-described embodiment and its variations, the reception circuit is described as one example of the front-end module. The front-end module may also be a transmission circuit. That is, the front-end module may include transmission filters and transmission power amplifiers, instead of the reception filters and reception low-noise amplifiers. In this case, the input side and output side of the filters, inductors, amplifiers, and the like are inverted. For example, the output terminal of the transmission power amplifier and the input terminal of the inductor are connected. The front-end module may also be a transmission and reception circuit.

In the above-described embodiment and its variations, the two inductors 41 and 42 are incorporated in the module board 91, but the present disclosure is not limited thereto. For example, one of the two inductors 41 and 42 may be incorporated in the module board 91, and the other may be mounted on the principal surface of the module board 91.

In the above-described embodiment and its variations, the inductor 41 is directly connected to the reception filter 61 and the reception low-noise amplifier 21, but the present disclosure is not limited thereto. The same applies to the inductor 42. For example, another circuit device may be connected between the reception filter 61 and the inductor 41 and/or between the inductor 41 and the reception low-noise amplifier 21. Specifically, a switch for switching connection between the reception filter 61 and the inductor 41 between conduction and nonconduction may be connected between the reception filter 61 and the inductor 41.

In the above-described embodiment and its variations, the front-end module includes the reception low-noise amplifiers 21 and 22 for the reception filters 61 and 62 in a one-to-one relationship, but the present disclosure is not limited thereto. For example, the front-end module may include a single low-noise amplifier shared by the reception filters 61 and 62. In this case, the front-end module may include a switch for switching connection between the low-noise amplifier and each of the reception filters 61 and 62 between conduction and nonconduction.

In the above-described embodiment and its variations, the coil conductor 414 in the inductor 41 overlaps neither the source inductor 215 nor the choke inductor 216 in the reception low-noise amplifier 21 and none of the planar ground patterns 911 and 912 and the plurality of post electrodes 93 in plan view, but the present disclosure is not limited thereto. For example, part or all of the coil conductor 414 may overlap the source inductor 215 and the choke inductor 216 in the reception low-noise amplifier 21, the planar ground patterns 911 and 912, the post electrodes 93, or any combination thereof in plan view. Even in such cases, the inductor 41 with the inductor board 413 can be incorporated in the module board 91, and at least part of the inductor 41 can overlap the reception low-noise amplifier 21 in plan view. Accordingly, the front-end module can suppress degradation in quality of transmission and reception signals and can be miniaturized.

In the above-described embodiment and its variations, the reception low-noise amplifiers 21 and 22 are included in the semiconductor IC 92 or 92B, but the present disclosure is not limited thereto. That is, the reception low-noise amplifiers 21 and 22 may not be included in the semiconductor IC 92 or 92B.

In the above-described embodiment and its variations, the case where the material of the module board 91 differs from the material of the inductor board 413 is described, but the present disclosure is not limited to this case. For example, the material of the module board 91 may be the same material of the inductor board 413. Specifically, the module board 91 and the inductor board 413 may be both silicon boards. In this case, the module board 91 and the inductor board 413 may be integrated in an inseparable manner.

In the second and third variations of the above-described embodiment, the output terminal 412 of the inductor 41 and the input terminal 211 of the reception low-noise amplifier 21 are joined in the case where the semiconductor IC 92B is incorporated in the module board 91, but the present disclosure is not limited to this case. That is, the output terminal 412 of the inductor 41 and the input terminal 211 of the reception low-noise amplifier 21 may also be joined in the case where the semiconductor IC 92 is mounted on the principal surface 91a or 91b of the module board 91.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A front-end module comprising:
a first board;
a filter mounted on the first board;
an amplifier circuit mounted on, or incorporated in, the first board; and
a first inductor incorporated in the first board and connected to a signal path that links the filter and the amplifier circuit,
wherein the first inductor comprises a second board, and as seen in a plan view of the front-end module, at least part of the first inductor overlaps at least part of the amplifier circuit.
2. The front-end module according to claim 1, wherein the amplifier circuit comprises a low-noise amplifier configured to amplify a high-frequency signal input through the filter from an antenna.
3. The front-end module according to claim 1,
wherein the amplifier circuit comprises a second inductor, and
wherein, as seen in the plan view, a coil conductor of the first inductor does not overlap the second inductor.
4. The front-end module according to claim 1,
wherein the first board comprises a planar ground pattern having a ground potential, and
wherein, as seen in the plan view, a coil conductor of the first inductor does not overlap the planar ground pattern.
5. The front-end module according to claim 1, further comprising:
a plurality of electrodes disposed on a principal surface of the first board, the plurality of electrodes being configured to connect the first board and an external board,
wherein, as seen in the plan view, a coil conductor of the first inductor does not overlap any of the plurality of electrodes.
6. The front-end module according to claim 5,
wherein the plurality of electrodes comprise three or more electrodes aligned in a first direction, and
wherein, as seen in the plan view, the first inductor is arranged between two neighboring electrodes in the first direction, the two neighboring electrodes being among the three or more electrodes.
7. The front-end module according to claim 1, wherein the amplifier circuit is incorporated in the first board.
8. The front-end module according to claim 1, wherein the first inductor is directly connected to the filter and to the amplifier circuit.
9. The front-end module according to claim 1, further comprising:
a first via conductor that connects an input/output terminal of the filter and a first input/output terminal of the first inductor in a direction perpendicular to a principal surface of the first board; and
a second via conductor that connects a second input/output terminal of the first inductor and an input/output terminal of the amplifier circuit in the direction perpendicular to the principal surface of the first board.
10. The front-end module according to claim 1, wherein an input/output terminal of the first inductor is joined to an input/output terminal of the amplifier circuit.
11. The front-end module according to claim 1, wherein a material of the second board is different from a material of the first board.
12. The front-end module according to claim 11, wherein a permittivity of the first board is different from a permittivity of the second board.
13. The front-end module according to claim 12, wherein the first board is a printed circuit board, and the second board is a silicon board.
14. The front-end module according to claim 1, wherein the amplifier circuit comprises a reception low-noise amplifier.
15. A communication apparatus comprising:
a radio frequency (RF) signal processing circuit configured to process high-frequency signals received at, and to be transmitted from, an antenna; and
the front-end module according to claim 1, the front-end module being configured to transmit the high-frequency signals between the antenna and the RF signal processing circuit.

* * * * *